United States Patent
Ho et al.

(10) Patent No.: US 9,407,266 B2
(45) Date of Patent: Aug. 2, 2016

(54) PROGRAMMABLE SINGLE-SUPPLY LEVEL-SHIFTER CIRCUIT

(71) Applicant: Xilinx, Inc., San Jose, CA (US)

(72) Inventors: Fu-Hing Ho, Los Gatos, CA (US); Gubo Huang, Milpitas, CA (US)

(73) Assignee: XILINX, INC., San Jose, CA (US)

( * ) Notice: Subject to any disclaimer, the term of this patent is extended or adjusted under 35 U.S.C. 154(b) by 56 days.

(21) Appl. No.: 14/466,569

(22) Filed: Aug. 22, 2014

(65) Prior Publication Data

US 2016/0056823 A1 Feb. 25, 2016

(51) Int. Cl.
*H03K 19/0175* (2006.01)
*H03K 19/0185* (2006.01)

(52) U.S. Cl.
CPC .... *H03K 19/017581* (2013.01); *H03K 19/0185* (2013.01)

(58) Field of Classification Search
USPC .......................................... 326/63, 68, 80–81
See application file for complete search history.

(56) References Cited

U.S. PATENT DOCUMENTS

| | | | | |
|---|---|---|---|---|
| 6,194,945 B1 * | 2/2001 | Bahramzadeh | .... | H03K 19/0027 326/38 |
| 7,061,273 B2 * | 6/2006 | Wang | ............. | H03K 19/018585 326/68 |
| 7,714,606 B2 * | 5/2010 | Ozawa | ................ | H01L 27/1203 326/30 |
| 7,800,407 B1 * | 9/2010 | Agarwal | ........ | H03K 19/018521 326/68 |

OTHER PUBLICATIONS

Garg, R., et al., "A Single-supply True Voltage Level Shifter", 2008 Design, Automation, and Test in Europe, Mar. 10-14, 2008, pp. 1-6, ICM, Munich, Germany.
Khan, Q.A., et al., "A Single Supply Level Shifter for Multi-Voltage Systems", 5th International Conference on Embedded Systems and Design, 19th International Conference on VLSI Design, VLSI Design 2006, Jan. 3-7, 2006, pp. 1-4, Hyderabad, India.
Manohar, et al., "Bidirectional Single-Supply Level Shifter with Wide Voltage Range for Efficient Power Management", IEEE Computer Society, 2012 25th International Conference on VLSI Design, Jan. 7-11, 2012, pp. 25-130, HICC, Hyderabad, India.
Tawfik, S.A., et al., Multi-$V_{th}$, Level Conversion Circuits for Multi-$V_{DD}$ Systems, , 2007 IEEE International Symposium on Circuits and Systems, 2007 ISCAS, May 27-30, 2007, pp. 1397-1400, New Orleans, Louisiana, US.

* cited by examiner

*Primary Examiner* — Douglas W Owens
*Assistant Examiner* — James H Cho
(74) *Attorney, Agent, or Firm* — Keith Taboada (57) ABSTRACT

In an example implementation, a level-shifter circuit in an integrated circuit (IC) includes a plurality field-effect transistors (FETs) coupled to provide: a first inverter having an input port configured to receive an input signal having a first supply voltage, an output port, and a bias port; a second inverter having an input port coupled to the output port of the first inverter, an output port, and a bias port coupled to a second supply voltage; a diode-connected FET coupled between the second supply voltage and the bias port of the first inverter; a first FET in parallel with the diode-connected FET having a gate coupled to the output of the second inverter; and a second FET in parallel with the diode-connected FET and the first FET having a gate configured to receive a mode select signal.

19 Claims, 5 Drawing Sheets

PROGRAMMABLE SINGLE-SUPPLY LEVEL-SHIFTER CIRCUIT

FIELD OF THE INVENTION

Examples of the present disclosure generally relate to electronic circuits and, in particular, to a programmable single-supply level-shifter circuit.

BACKGROUND

Modern system on chip (SoC) integrated circuits (ICs) ("SoC's") can have multiple voltage domains to operate different parts at different supply voltages. The use of multiple voltage domains can allow for efficient power management. To transmit signals across voltage domains, a "level-shifter circuit" can be provided at the receiver to shift the supply voltage of the transmitted signal to the voltage domain of the receiver. Conventional level-shifter circuits require supply voltages from both voltage domains in order to shift supply voltage of a signal from one domain to another. These "multi-supply" level shifter circuits can cause power routing congestion in the SoC due to the need to provide multiple supply voltages at each receiver of signals transitioning between voltage domains. Further, in dynamically scalable SoCs, supply voltages can be unknown prior to silicon implementation.

A single-supply level-shifter circuit is another type of level-shifter that operates using a single supply in the voltage domain of the receiver. Existing single-supply level-shifter circuits have limited operating range, are slow over the range of operation, are unidirectional, and/or are implementation area intensive.

SUMMARY

Programmable single-supply level-shifter circuits are described. In one example implementation, a level-shifter circuit in an integrated circuit (IC) includes a plurality field-effect transistors (FETs) coupled to provide: a first inverter having an input port configured to receive an input signal having a first supply voltage, an output port, and a bias port; a second inverter having an input port coupled to the output port of the first inverter, an output port, and a bias port coupled to a second supply voltage; a diode-connected FET coupled between the second supply voltage and the bias port of the first inverter; a first FET in parallel with the diode-connected FET having a gate coupled to the output of the second inverter; and a second FET in parallel with the diode-connected FET and the first FET having a gate configured to receive a mode select signal.

In another example implementation, an IC system includes a plurality of ICs configured with a plurality of voltage domains, at least one IC of the plurality of ICs having a plurality of single-supply level-shifter circuits each including: a first inverter having an input port configured to receive an input signal having a supply voltage in one of the plurality of voltage domains, an output port, and a bias port; a second inverter having an input port coupled to the output port of the first inverter, an output port, and a bias port coupled to another supply voltage in another one of the plurality of voltage domains; a diode-connected FET coupled between the other supply voltage and the bias port of the first inverter; a first FET in parallel with the diode-connected FET having a gate coupled to the output of the second inverter; and a second FET in parallel with the diode-connected FET and the first FET having a gate configured to receive a mode select signal.

In another example implementation, a method of translating supply voltage level of a signal input to a receiver in a programmable IC includes: coupling the signal having a first supply voltage to a single-supply level-shifter circuit in the receiver having a second supply voltage and a mode select circuit; driving a mode select signal to the mode select circuit to configure the single-supply level-shifter circuit in either a first mode or a second mode, the first mode being selected if the first supply voltage is greater than or equal to the second supply voltage, the second mode being selected if the first supply voltage is less than the second supply voltage; and providing a translated signal having the second supply voltage.

Other features will be recognized from considering the Detailed Description and Claims, which will follow.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

A programmable single-supply level-shifter circuit is described. In an example implementation, a level-shifter circuit in an integrated circuit includes a plurality of field effect transistors (FETs) coupled to provide first and second inverters, a diode-connected FET, and first and second FETs. The first inverter has an input port configured to receive an input signal having a first supply voltage and is biased by the diode-connected FET coupled to a second supply voltage. The second inverter has an input port coupled to an output port of the first inverter and is biased by the second supply voltage. The first FET is in parallel with the diode-connected FET and has a gate coupled to an output of the second inverter. The second FET is in parallel with the diode-connected FET and the first FET and has a gate configured to receive a mode select signal.

To translate supply voltage of an input signal, the signal is coupled to the input of the first inverter. The mode select signal is driven to configure the level-shifter circuit in either a first mode or a second mode. The first mode is selected if the supply voltage of the input signal is greater than or equal to the second supply voltage biasing the level-shifter. In this mode, the second FET biases the first inverter with the second supply voltage and the level-shifter can operate as a buffer that adds minimal delay to the signal. Further, no dynamic or static power is consumed by the level-shifter. The second mode is selected if the supply voltage of the input signal is less than the second supply voltage biasing the level-shifter. In this mode, the diode-connected FET biases the first inverter with a lower supply voltage (e.g., the second supply voltage less a threshold voltage of the diode-connected FET) to accommodate the lower supply voltage of the input signal. Within an operational range, the level-shifter consumes no static power. The reduced bias voltage of the first inverter, which is necessary to accommodate the lower input supply voltage, introduces some additional delay as compared to the first mode.

Hence, the level-shifter circuit is a single-supply level-shifter circuit that is programmable to accommodate the supply voltage of the input signal. The level-shifter circuit is bi-directional (e.g., both low-to-high and high-to-low voltage translations are supported) with an optimized implementation in terms of operational speed and power tailored for each mode. As such, impact on design performance and power consumption is minimized. In particular, the level-shifter is selectively configured so that high-to-low voltage translations do not exhibit a delay penalty. The level-shifter circuit can be programmed statically startup (e.g., supporting a static voltage scaling implementation) or dynamically during operation (e.g., additionally supporting multilevel or dynamic voltage scaling implementations). The level-shifter requires minimal IC implementation area, which conserves valuable IC real estate. SoC's, for example, can have a large number of connections between voltage domains (e.g., on the order of 10,000 connections), requiring a corresponding large number of level-shifter circuits.

Figure 1:
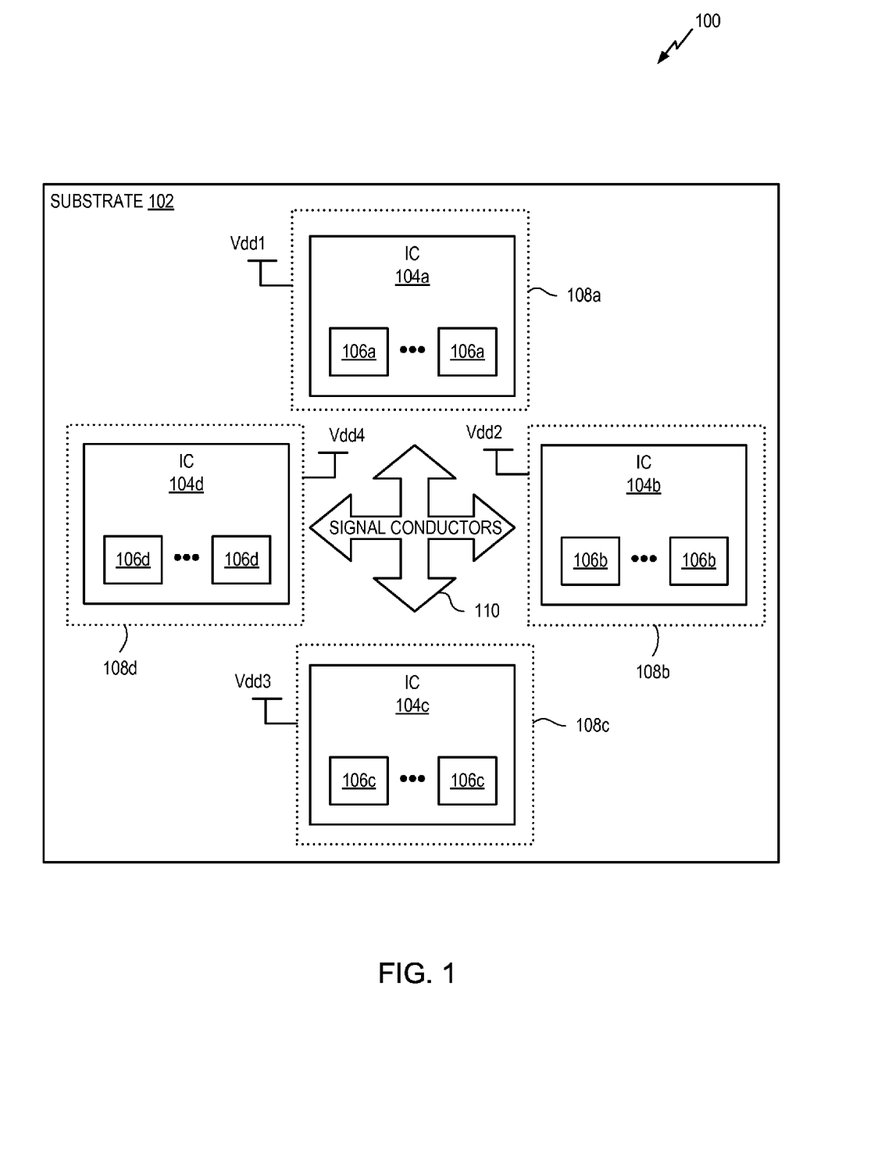
FIG. 1 is a block diagram depicting an integrated circuit (IC) system according to an example implementation.

FIG. 1 is a block diagram depicting an integrated circuit (IC) system 100 according to an example implementation. The IC system 100 includes a substrate 102 having a plurality of ICs. For example, the IC system 100 may be a system on chip (SoC) IC ("SoC"), where the substrate 102 is a circuit board or interposer that includes signal conductors for routing signals between ICs supported thereon. The IC system 100 may be packaged (not shown) as a single SoC device. In another example, the substrate 102 may be a circuit board having multiple discrete ICs. In the example, four ICs 104a through 104d (collectively "ICs 104"), but the substrate 102 can include more or less ICs. The ICs 104 can be coupled to each other through signal conductors 110 on the substrate 102.

The ICs 104a through 104d include voltage domains 108a through 108d, respectively (collectively "voltage domains 108"). Each of the voltage domains 108 can include one or more supply voltages. The supply voltage(s) in one voltage domain can be different than the supply voltage(s) in another domain. In the example, the voltage domains 108a through 108d include supply voltages Vdd1 through Vdd4, respectively. At least some of the supply voltages Vdd1 through Vdd4 can be different from one another. In various examples described herein, two different configurations are described: (1) one supply voltage is greater than or equal to another supply voltage; or (2) one supply voltage is less than another supply voltage. By "equal to", it is meant that the input supply voltage is within a specific threshold of intended output supply voltage and not exact equality. Thus, "less than" encompasses the input supply voltage being outside of the equality threshold.

One or more ICs on the substrate 102 can include single-supply level-shifter circuits ("SS-LS circuits") for translating signals between voltage domains. The SS-LS circuits can programmable. Programmable SS-LS circuits can be programmed to operate in two different modes depending on the relation between input and output voltage domains. In a first mode, a programmable SS-LS circuit can translate between an input supply voltage that is greater than or equal to an output supply voltage. In a second mode, a programmable SS-LS circuit can translate between an input voltage that is less than an output supply voltage. Each of the programmable SS-LS circuits is biased using a single source of the output voltage domain. In the present example, the IC 104a can include a plurality of programmable SS-LS circuits 106a, the IC 104b can include a plurality of programmable SS-LS circuits 106b, the IC 104c can include a plurality of programmable SS-LS circuits 106c, and the IC 104d can include a plurality of programmable SS-LS circuits 106d. The programmable SS-LS circuits 106a through 106d are generally referred to as programmable SS-LS circuits 106. The programmable SS-LS circuits 106 in any of the ICs 104 can be programmed to translate between any of the voltage domains 108.

Figure 2:
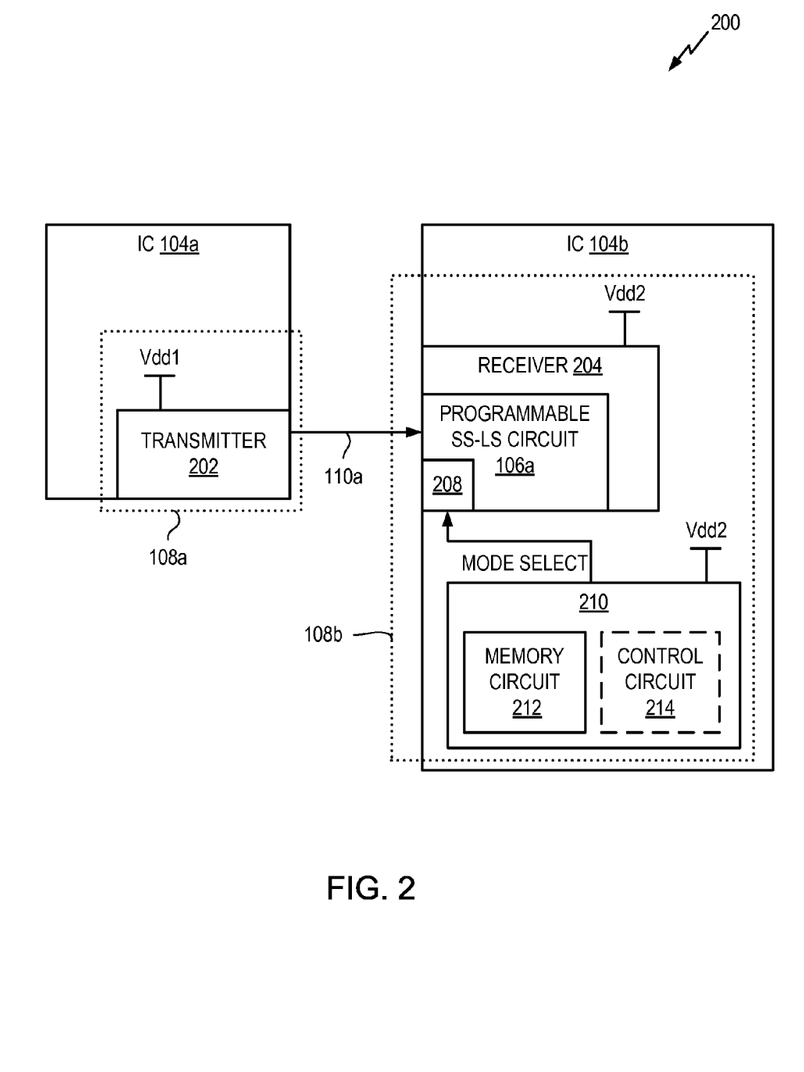
FIG. 2 is a block diagram depicting a portion of the IC system of FIG. 1 according to an example implementation.

FIG. 2 is a block diagram depicting a portion 200 of the IC system 100 of FIG. 1 according to an example implementation. Elements of FIG. 2 that are the same or similar to those of FIG. 1 are designated with identical reference numerals. The portion 200 includes the IC 104a coupled to the IC 104b through a signal conductor 110a on the substrate 102 (the substrate is omitted for clarity). The IC 104a includes a transmitter 202 in the voltage domain 108a. The transmitter 202 is biased with the supply voltage Vdd1. The transmitter 202 generates a digital signal ("signal") having the supply voltage Vdd1. That is, the signal can vary between Vdd1 (e.g., logic HIGH) and a reference voltage (e.g., logic LOW). The reference voltage can be electrical ground for the ICs 104a and 104b or a known reference voltage (e.g., a known supply voltage Vss).

The IC 104b includes a receiver 204 in the voltage domain 108b. The receiver 204 and its components are biased with the supply voltage Vdd2. The receiver 204 includes a programmable SS-LS circuit 106a coupled to the signal conductor 110a to receive the signal from the transmitter 202. The programmable SS-LS circuit 106a shifts the supply voltage level of the signal from Vdd1 of the voltage domain 108a to Vdd2 of the voltage domain 108b. The signal can then be processed by other components (not shown) in the receiver 204 or the IC 104b within the voltage domain 108b.

The programmable SS-LS circuit 106a includes a mode select circuit 208. The mode select circuit 208 configures the programmable SS-LS circuit 106a in either a first mode or a second mode. As noted above, the first mode can be configured when the supply voltage Vdd1 is greater than or equal to the supply voltage Vdd2. The second mode can be configured when the supply voltage Vdd1 is less than the supply voltage Vdd2. The mode select circuit 208 can be driven by a mode select signal generated by a circuit 210 in the IC 104b. The circuit 210 can be part of the voltage domain 108b and biased using the supply voltage Vdd2. The mode select signal can vary between logic HIGH and logic LOW values within the voltage domain 108b. In an example, a logic HIGH value programs the mode select circuit 208 to implement the first mode, and a logic LOW value programs the mode select circuit 208 to implement the second mode. In general, the mode select circuit 208 can implement logic such that the first mode is implemented when the mode select signal has one logic state, and the second mode is implemented when the mode select signal has another logic state.

In one example implementation, the circuit 210 includes a memory circuit 212. The memory circuit 212 can be configured to statically drive the mode select signal to one of a logic HIGH or logic LOW value. By "statically drive", it is meant that the value of the mode select signal does not change while power is applied to the IC 104b after being initially set. For example, the IC 104b can be a programmable IC, such as a field programmable gate array (FPGA), complex programmable logic device (CPLD), or like type programmable device that has a specific set of programmable resources that can be programmed to implement circuits. The memory circuit 212 can be programmed to drive the mode select signal with either a logic HIGH or logic LOW value when the programmable IC is programmed with a circuit (e.g., if the programmable IC is an FPGA, when the FPGA is configured). A statically driven mode select signal can be used in a static voltage scaling implementation, where the supply voltages between input and output domains do not change.

In another example implementation, the circuit 210 includes a control circuit 214 in place of or in addition to the memory circuit 212. The control circuit 214 is configured to dynamically drive the mode select signal to between logic HIGH and logic LOW. By "dynamically drive", it is meant that the value of the mode select signal can change while power is applied to the IC 104b. For example, the IC 104b can be a programmable IC, such as an FPGA or the like. The control circuit 214 can be a dedicated circuit in the programmable IC or be configured from programmable logic of the programmable IC. The control circuit 214 can selectively drive the mode select signal between logic HIGH and logic LOW. The control circuit 214 can establish an initial value for the mode select signal upon power being applied to the IC 104b. In an example, if the memory circuit 212 is present, the control circuit 214 can obtain the initial value for the mode select signal from the memory circuit 212, which can be configured as described above. A dynamically driven mode select signal can be used in multilevel voltage scaling or dynamic voltage scaling implementations, where the supply voltages between input and output domains can change. The control circuit 214 can generate the mode select signal based on input from another circuit (not shown) that drives the multilevel or dynamic voltage scaling process.

Figure 3:
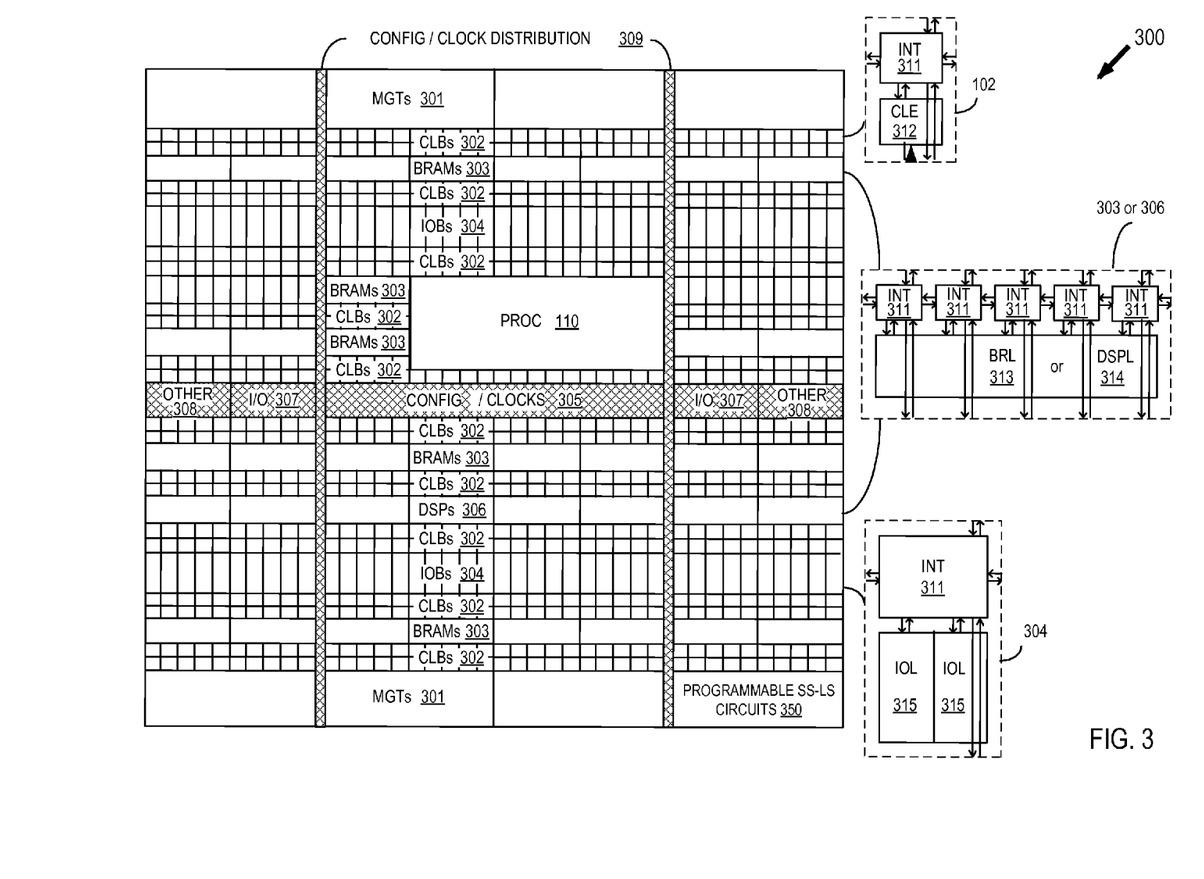
FIG. 3 illustrates a field programmable gate array (FPGA) architecture according to an example implementation.

In some examples, one or more of the ICs in the IC system 100 can be a programmable IC, such as an FPGA, CPLD, or the like. For example, FIG. 3 illustrates an FPGA architecture ("FPGA 300") that includes a large number of different programmable tiles including multi-gigabit transceivers ("MGTs") 301, configurable logic blocks ("CLBs") 302, random access memory blocks ("BRAMs") 303, input/output blocks ("IOBs") 304, configuration and clocking logic ("CONFIG/CLOCKS") 305, digital signal processing blocks ("DSPs") 306, specialized input/output blocks ("I/O") 307 (e.g., configuration ports and clock ports), and other programmable logic 308 such as digital clock managers, analog-to-digital converters, system monitoring logic, and so forth. Some FPGAs also include dedicated processor blocks ("PROC") 310.

In some FPGAs, each programmable tile includes a programmable interconnect element ("INT") 311 having standardized connections to and from a corresponding interconnect element in each adjacent tile. Therefore, the programmable interconnect elements taken together implement the programmable interconnect structure for the illustrated FPGA. The programmable interconnect element 311 also includes the connections to and from the programmable logic element within the same tile, as shown by the examples included at the top of FIG. 3.

For example, a CLB 302 can include a configurable logic element ("CLE") 312 that can be programmed to implement user logic plus a single programmable interconnect element ("INT") 311. A BRAM 303 can include a BRAM logic element ("BRL") 313 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 306 can include a DSP logic element ("DSPL") 314 in addition to an appropriate number of programmable interconnect elements. An 10B 304 can include, for example, two instances of an input/output logic element ("IOL") 315 in addition to one instance of the programmable interconnect element 311. As will be clear to those of skill in the art, the actual I/O pads connected, for example, to the I/O logic element 315 typically are not confined to the area of the input/output logic element 315.

In the pictured example, a horizontal area near the center of the die (shown in FIG. 3) is used for configuration, clock, and other control logic. Vertical columns 309 extending from this horizontal area or column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, processor block 310 spans several columns of CLBs and BRAMs.

Note that FIG. 3 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 3 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

The FPGA 300 can also include programmable SS-LS circuits 350 that function similar to the programmable SS-LS circuits 106 described above. In the example of FIG. 2, if the IC 104b includes the FPGA 300, the circuit 210 can be either dedicated circuitry in the FPGA 300 or configured using programmable logic of the FPGA 300. The programmable SS-LS circuits 350 can be coupled to other circuits in the FPGA 300 that make use of the level-translated signals.

Figure 4:
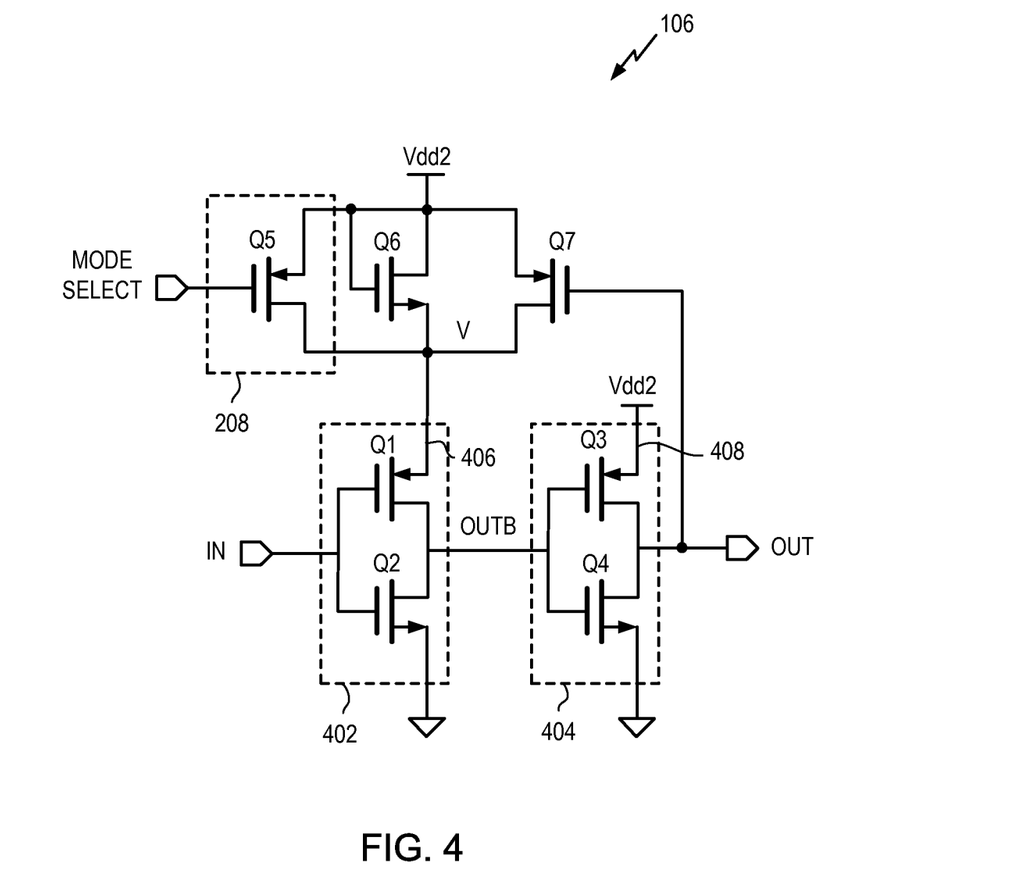
FIG. 4 is a schematic diagram of a programmable single-supply level-shifter (SS-LS) circuit according to an example implementation.

FIG. 4 is a schematic diagram of a programmable SS-LS circuit 106 according to an example implementation. The programmable SS-LS circuit 106 includes a plurality of field-effect transistors (FETs) designated Q1 through Q7. The transistors Q1 and Q2 are coupled to implement a first inverter 402 having an input port ("IN"), an output port ("OUTB"), and a bias port 406. Transistors Q3 and Q4 are coupled to implement a second inverter 404 having an input port coupled to OUTB, an output port ("OUT"), and a bias port 408. The first and second inverters 402 and 404 can be biased with respect to a reference voltage shown by way of example as electrical ground.

In the example of FIG. 4, the inverters 402 and 404 each include a complementary metal-oxide-semiconductor (CMOS) pair of FETs coupled between respective bias ports 406 and 408 and the reference voltage. That is, the transistor Q1 comprises a p-type metal-oxide-semiconductor (PMOS) transistor, and the transistor Q2 comprises an n-type metal-oxide-semiconductor (NMOS) transistor. The source of Q1 is coupled to the bias port 406. The drain of Q1 is coupled to the drain of Q2. The source of Q2 is coupled to the reference voltage. Gates of Q1 and Q2 are coupled to IN. The drains of Q1 and Q2 are coupled to OUTB. Likewise, the transistor Q3 comprises a PMOS transistor, and the transistor Q4 comprises an NMOS transistor. The source of Q3 is coupled to the bias port 408. The drain of Q3 is coupled to the drain of Q4. The source of Q4 is coupled to the reference voltage. Gates of Q3 and Q4 are coupled to OUTB. The drains of Q1 and Q2 are coupled to OUT. The bias port 408 is coupled to a supply voltage Vdd2.

The transistor Q6 is a diode-connected FET coupled between the supply voltage Vdd2 and the bias port 406 of the inverter 402. The transistor Q6 can be an NMOS transistor having a gate and a drain coupled to the supply voltage Vdd2, and a source coupled to the bias port 406 (e.g., the source of the transistor Q1).

The transistor Q7 is in parallel with the transistor Q6 and has a gate coupled to OUT (e.g., the drains of Q3 and Q4). The transistor Q7 can be a PMOS transistor having a source coupled to the supply voltage Vdd2 and a drain coupled to the source of Q6.

The transistor Q5 forms the mode select circuit 208. The transistor Q5 is in parallel with the transistors Q6 and Q7 and has a gate configured to receive the mode select signal. The transistor Q5 can be a PMOS transistor having a source coupled to the supply voltage Vdd2 and a drain coupled to the source of Q6 and drain of Q7. The junction of the Q5 drain, the Q6 source, the Q7 drain, and the bias port 406 (e.g., Q1 source) is referred to as node V.

In operation, the mode select signal determines the mode of the programmable SS-LS circuit 106. When the mode select signal is logic LOW, the programmable SS-LS circuit 106 is configured to translate a signal having an input voltage supply that is greater than or equal to the supply voltage Vdd2. When the mode select signal is logic LOW, the transistor Q5 saturates and "turns on". The node V is charged to the supply Vdd2 and the transistor Q6 is cutoff. Thus, both inverters 402 and 404 are biased with the supply voltage Vdd2. The inverters 402 and 404 form a buffer (i.e., two logical inversions in sequence) and the signal on OUT will track logical changes in the signal coupled to IN and have a supply voltage of Vdd2.

When the mode select signal is logic HIGH, the programmable SS-LS circuit 106 is configured to translate a signal having an input voltage supply that is less than the supply voltage Vdd2. When the mode select signal is HIGH, the transistor Q5 is cutoff. Operation in the second mode can be understood with respect to static logic HIGH, falling edge, static logic LOW, and rising edge phases of the signal on IN (all within the input voltage domain). When the signal on IN is static logic HIGH, the transistor Q6 saturates and charges the node V to a voltage of Vdd2−Vth_Q6, where Vth_Q6 is the threshold voltage of the transistor Q6. If the logic HIGH voltage of the signal on IN is greater than Vdd2−Vth_Q6−Vth_Q1 (threshold voltage of Q1), then the transistor Q1 is cutoff. The node OUTB will discharge to the reference voltage. The transistor Q3 saturates and is turned on, and the transistor Q4 is cutoff. The node OUT is charged to Vdd2 (i.e., logic HIGH in the output voltage domain).

When the signal on IN transitions from logic HIGH to logic LOW (e.g., falling edge), the transistor Q1 will begin to saturate and turn on, charging the node OUTB towards Vdd2−Vth_Q6. The transistor Q4 will begin to saturate and turn on, discharging the node OUT towards the reference voltage. Q7 will start to saturate and turn on, charging the node V towards Vdd. When the signal IN is static logic LOW, the transistor Q1 is saturated and turned on, charging the node OUTB to Vdd2.

The transistor Q3 will be cutoff, and the transistor Q4 will be saturated and turned on. The node OUT will be discharged to the reference voltage.

When the signal on IN transitions from logic LOW to logic HIGH (e.g., rising edge), the transistor Q2 begins to saturate and turn on, discharging the node OUTB towards the reference voltage. The transistor Q3 will being to saturate and turn on, charging OUT towards Vdd2. The transistor Q7 will be cutoff, and the transistor Q6 will charge the node V to Vdd2−Vth_Q6. The supply voltage of the signal on IN should be greater than Vdd2−Vth_Q6−Vth_Q1 to avoid turning on Q1 and burning static current.

The programmable SS-LS circuit 106 requires little implementation area in an IC, consumes no static power when used in its operating range, and has minimal or no delay penalty. The programmable SS-LS circuit 106 has minimal impact on design performance. The programmable SS-LS circuit 106 is also bi-directional (e.g., provides for both low-to-high and high-to-low translations). The low static and dynamic power consumption of the programmable SS-LS circuit 106 reduces IC power and cooperates with the purpose of voltage scaling. The low implementation area allows the programmable SS-LS circuit 106 to be used in ICs that have a large number of connections between voltage domains.

Figure 5:
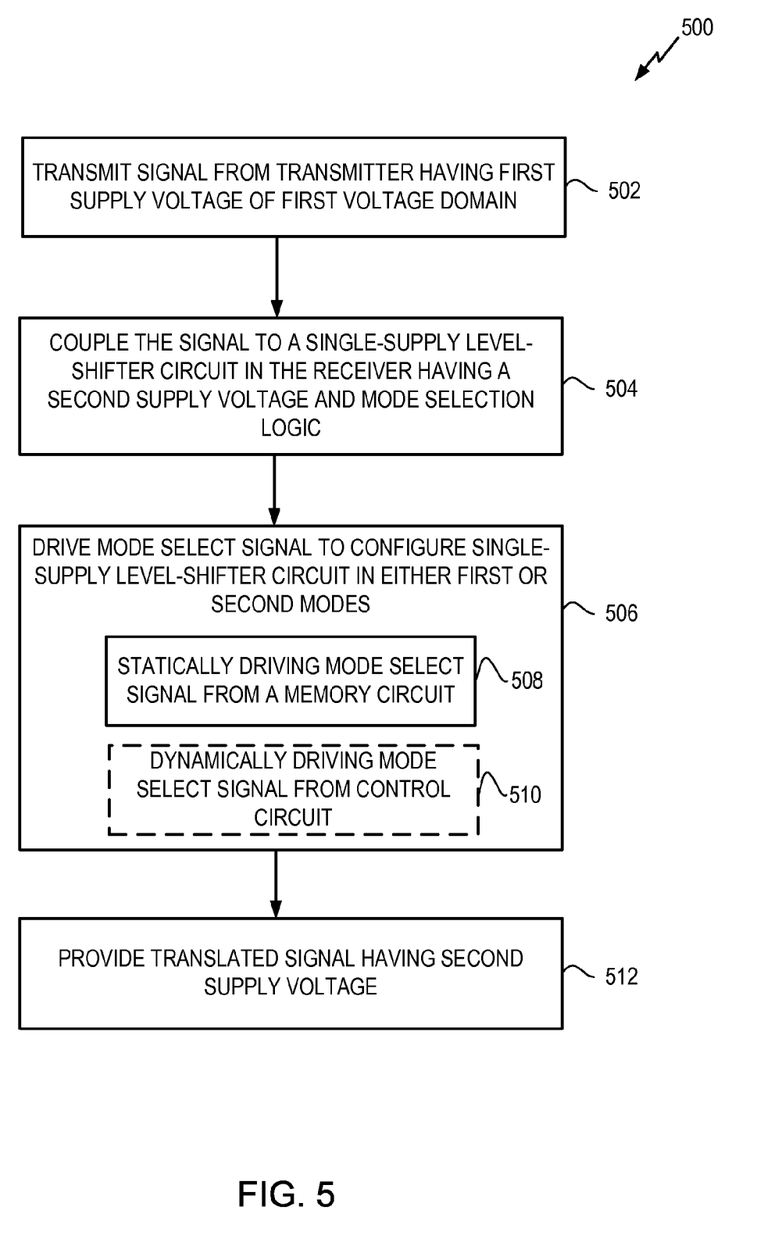
FIG. 5 is a flow diagram depicting a method of translating supply voltage level of a signal input to a receiver in a programmable IC according to an example implementation.

FIG. 5 is a flow diagram depicting a method 500 of translating supply voltage level of a signal input to a receiver in a programmable IC according to an example implementation. The method 500 begins at step 502, where a transmitter transmits a signal having a first supply voltage of a first voltage domain. At step 504, the signal is coupled to a programmable SS-LS circuit in the receiver having a second supply voltage and a mode select circuit. At step 506, a mode select signal is driven to configure the programmable SS-LS circuit in either first or second modes. In one example implementation, step 506 includes a step 508, where the mode select signal is statically driven from a memory circuit. In another example, step 506 includes a step 510, where the mode select signal is dynamically driven from a control circuit. At step 512, the translated signal is provided having the second supply voltage. In an example, the transmitter is in an IC coupled to the programmable IC. The programmable SS-LS-circuit can have an implementation as shown in FIG. 4 and described above.

While the foregoing is directed to specific examples, other and further examples may be devised without departing from the basic scope thereof, and the scope thereof is determined by the claims that follow.

What is claimed is:

1. A level-shifter circuit in an integrated circuit (IC), comprising:
   a plurality field-effect transistors (FETs) coupled to provide:
      a first inverter having an input port configured to receive an input signal having a first supply voltage, an output port, and a bias port;
      a second inverter having an input port coupled to the output port of the first inverter, an output port, and a bias port coupled to a second supply voltage;
      a diode-connected FET coupled between the second supply voltage and the bias port of the first inverter;
      a first FET in parallel with the diode-connected FET having a gate coupled to the output of the second inverter; and
      a second FET in parallel with the diode-connected FET and the first FET having a gate configured to receive a mode select signal.

2. The level-shifter circuit of claim 1, wherein the first inverter and the second inverter each include a complementary metal-oxide-semiconductor (CMOS) pair of FETs coupled between the respective bias ports and a reference voltage.

3. The level-shifter circuit of claim 1, wherein:
the diode-connected FET comprises an n-type metal-oxide-semiconductor (NMOS) FET having a gate and a drain coupled to the second supply voltage and a source coupled to the bias port of the first inverter;
the first FET comprises a first p-type metal-oxide-semiconductor (PMOS) FET having a source coupled to the second supply voltage and a drain coupled to the source of the NMOS FET; and
the second FET comprises a second PMOS FET having a source coupled to the second supply voltage and a drain coupled to the drain of the first PMOS FET and the source of the NMOS FET.

4. The level-shifter circuit of claim 1, wherein the gate of the second FET is coupled to a memory circuit of the IC to receive the mode select signal.

5. The level-shifter circuit of claim 4, wherein the memory circuit of the IC is configured to statically drive the mode select signal to one of a logic high or logic low value.

6. The level-shifter circuit of claim 1, wherein the gate of the second FET is coupled to a control circuit of the IC to receive the mode select signal, where the control circuit is configured to dynamically drive the mode select signal between logic high or logic low values.

7. An integrated circuit (IC) system, comprising:
a plurality of ICs configured with a plurality of voltage domains, at least one IC of the plurality of ICs having a plurality of single-supply level-shifter circuits each including:
a first inverter having an input port configured to receive an input signal having a supply voltage in one of the plurality of voltage domains, an output port, and a bias port;
a second inverter having an input port coupled to the output port of the first inverter, an output port, and a bias port coupled to another supply voltage in another one of the plurality of voltage domains;
a diode-connected FET coupled between the other supply voltage and the bias port of the first inverter;
a first FET in parallel with the diode-connected FET having a gate coupled to the output of the second inverter; and
a second FET in parallel with the diode-connected FET and the first FET having a gate configured to receive a mode select signal.

8. The IC system of claim 7, further comprising:
a first IC including a transmitter in a first voltage domain of the plurality of voltage domains, the transmitter configured to provide a signal having a first supply voltage of the first voltage domain; and
a second IC including a receiver in a second voltage domain of the plurality of voltage domains, the receiver including a first single-supply level-shifter circuit of the plurality of single-supply level-shifter circuits where the supply voltage in the one of the plurality of voltage domains is the first supply voltage in the first voltage domain and the other supply voltage in the other of the plurality of voltage domains is the second supply voltage in the second voltage domain.

9. The IC system of claim 8, further comprising:
a substrate supporting the first IC and the second IC, the substrate including a conductor to provide the signal from the transmitter in the first IC to the receiver in the second IC.

10. The IC system of claim 7, wherein the at least one IC comprises a programmable IC.

11. The IC system of claim 10, wherein, for each of the plurality of single-supply level-shifter circuits, the gate of the second FET is coupled to a memory circuit of the programmable IC to receive the mode select signal.

12. The IC system of claim 11, wherein each memory circuit coupled to a respective single-supply level-shifter circuit is configured to statically drive a respective mode select signal to one of a logic high or logic low value.

13. The IC system of claim 10, wherein, for each of the plurality of single-supply level-shifter circuits, the gate of the second FET is coupled to a control circuit of the programmable IC to receive the mode select signal, where the control circuit is configured to dynamically drive the mode select signal between logic high or logic low values.

14. The IC system of claim 10, wherein the programmable IC comprises a field programmable gate array (FPGA).

15. A method of translating supply voltage level of a signal input to a receiver in a programmable IC, comprising:
coupling the signal having a first supply voltage to a single-supply level-shifter circuit in the receiver having a second supply voltage and a mode select circuit;
driving a mode select signal to the mode select circuit to configure the single-supply level-shifter circuit in either a first mode or a second mode, the first mode being selected if the first supply voltage is greater than or equal to the second supply voltage, the second mode being selected if the first supply voltage is less than the second supply voltage;
wherein the single-supply level-shifter circuit comprises a plurality of field-effect transistors (FETs) coupled to provide:
a first inverter having an input port configured to receive the signal, an output port, and a bias port;
a second inverter having an input port coupled to the output port of the first inverter, an output port, and a bias port coupled to the second supply voltage;
a diode-connected FET coupled between the second supply voltage and the bias port of the first inverter;
a first FET in parallel with the diode-connected FET having a gate coupled to the output of the second inverter; and
a second FET in parallel with the diode-connected FET and the first FET having a gate configured to receive the mode select signal; and
providing a translated signal having the second supply voltage.

16. The method of claim 15, wherein the step of driving the mode select signal comprises:
statically driving the mode select signal from a memory circuit in the programmable IC to configure the single-supply level-shifter circuit in either the first mode or the second mode.

17. The method of claim 15, wherein the step of driving the mode select signal comprises:
dynamically driving the mode select signal from a control circuit in the programmable IC to selectively configure the single-supply level-shifter circuit between the first mode or the second mode.

18. The method of claim 15, further comprising:
providing the signal from a transmitter of a first voltage domain that includes the first supply voltage;

wherein the receiver is in a second voltage domain having the second supply voltage.

19. The method of claim 18, wherein the transmitter is in an IC coupled to the programmable IC.

* * * * *